United States Patent [19]
Kobayashi

[11] Patent Number: 5,371,708
[45] Date of Patent: Dec. 6, 1994

[54] FIFO-TYPE SEMICONDUCTOR DEVICE

[75] Inventor: Shotaro Kobayashi, Tokyo, Japan

[73] Assignee: NEC Corporation, Tokyo, Japan

[21] Appl. No.: 36,233

[22] Filed: Mar. 24, 1993

[30] Foreign Application Priority Data

Mar. 26, 1992 [JP] Japan .................. 4-067853

[51] Int. Cl.⁵ .............................................. G11C 7/00
[52] U.S. Cl. ................... 365/221; 365/230.01;
365/239; 365/240; 365/189.12
[58] Field of Search .................. 365/230.01, 239, 240,
365/189.12, 221, 189.01, 222

[56] References Cited

U.S. PATENT DOCUMENTS 4,800,530 1/1989 Itoh et al. ...................... 365/189.12
5,150,327 9/1992 Matsushima et al. ............... 365/221

Primary Examiner—Eugene R. LaRoche
Assistant Examiner—Huan Hoang
Attorney, Agent, or Firm—Sughrue, Mion, Zinn, Macpeak & Seas

[57] ABSTRACT

A semiconductor memory device of FIFO type is disclosed. The memory device has a test function for easy analysis of irregularities. A read data register for holding read data from the memory cells and a write data register for holding write data to the cells are provided corresponding to the memory cell array of the memory device. Further, bypass switch means for directly transferring data from the write data register into the read data register is provided.

15 Claims, 7 Drawing Sheets

FIFO-TYPE SEMICONDUCTOR DEVICE

BACKGROUND OF THE INVENTION

1. Field of the Invention

The present invention relates to a semiconductor memory device, in particular to a semiconductor memory device of FIFO (First In First Out) type to be used for picture recording or the like.

2. Description of the Related Art

A field memory or a frame memory adapted for recording graphic data or image data is normally composed of a semiconductor memory device of FIFO type. Since it processes image data, the semiconductor memory device of the FIFO type is required to operate at high speed and to have a sufficiently large memory capacity. In order to meet these requirements, a semiconductor memory device provided with a memory cell array is usually employed. The memory cell array is constructed by using a dynamic memory cell which can be highly integrated. The memory device also has respective registers for reading and writing connected to each pair of bit lines of the memory cell array.

FIG. 1 shows the structure of a memory cell portion and a data register portion of the semiconductor memory device of the conventional FIFO type. In the memory device, memory cell array 1 of universally known structure is composed of memory cells $C_{11}$ to $C_{mn}$ of a dynamic type arranged in the of a matrix of m rows and n columns.

In memory cell array 1, there are provided word lines $WL_1$ to $WL_m$ for selection of rows and bit line pairs $D_1/\overline{D_1}$ to $D_n/\overline{D_n}$ for reading or writing data from or into the memory cells. The memory cell array 1 is arranged so that the data held in the memory cells selected by the word line is transmitted from the memory cells to bit lines $D_1$ to $D_n$ and $\overline{D_1}$ to $\overline{D_n}$.

Each of bit line pairs $D_1/\overline{D_n}$ to $D_n/\overline{D_n}$ is provided with a balancer 2 and a sense of amplifier 3. The balancer 2 receives balance signal BL and reference voltage Ref and precharges the corresponding bit line pair to reference voltage Ref according to balance signal BL. The sense amplifier 3 is a differential amplifier and is activated by two sense amplifier activation signals SEP, SEN to amplify the data transmitted to the bit line pair. Each of the bit line pairs $D_1/\overline{D_1}$ to $D_n/\overline{D_n}$ is provided with a read data register $RR_1$ to $RR_n$ an a write data register $WR_1$ to $WR_n$.

Further, the semiconductor memory device comprises a read register switch 5, a read register pointer 6, a write register switch 10 and a write register pointer 11. The read register switch 5 is composed of 2n transfer gates $RDT_a$ to $RDT_z$. These transfer gates connect each bit line pair $D_1/\overline{D_1}$ to $D_n/\overline{D_n}$ and each read data register $RR_1$ to $RR_n$ corresponding to the read transfer signal RDTG inputted to all of the transfer gates. For example, transfer gate $RDT_a$ connects bit line $D_1$ and one end of read data register $RR_1$, and transfer gate $RDT_b$ connects bit line $\overline{D_1}$ and the other end of read data register $RR_1$.

The read register pointer 6 consists of an n-stage shift register 7 for read and a number n of transfer gates $PR_1$ to $PR_n$. Transfer gates $PR_1$ to $PR_n$ are each used to connect one of the read data registers $RR_1$ through $RR_n$ to the read data bus RB corresponding to the output of the shift register 7. For example, transfer gate $PR_1$ is controlled by the output of the first stage of shift register 7 to connect one end of read data register $RR_1$ and read data bus RB, and transfer gate $PR_2$ is controlled by the output of the second stage of shift register 7 to connect read data register $RR_2$ and read data bus RB. The shift register 7 for read is arranged so as to operate in synchronization with the read clock RCK.

The write register switch 10 is composed of a number 2n of transfer gates $WDT_a$ to $WDT_z$. These transfer gates each connect each of bit line pairs $D_1/\overline{D_1}$ to $D_n/\overline{D_n}$ and each write data register $WR_1$ to $WR_n$ corresponding to the write transfer signal WDTG inputted to all of the transfer gates. For example, transfer gate $WDT_a$ connects bit line $D_1$ and one end of write data register $WR_1$, and transfer gate $WDT_b$ connects bit line $\overline{D_1}$ and the other end of write data register $WR_1$.

The write register pointer 11 consists of an n-stage shift register 12 for write and n pairs of transfer gates $PW_1$ to $PW_n$. Transfer gates $PW_1$ to $PW_n$ are each used to connect one of the write data registers $WR_1$ through $WR_n$ to the write data bus WB/$\overline{WB}$ corresponding to the output of the write shift register 11. The write data bus WB/$\overline{WB}$ is composed of a pair of write data lines WB, $\overline{WB}$. For example, transfer gate $PW_1$ is controlled by the output of a first stage of shift register 11 to connect one end of write data register $WR_1$ and write data line WB and to also connect the other end of write data register $WR_1$ and write data line $\overline{WB}$. The shift register 11 for write is made so as to operate in synchronization with the write clock WCK.

In the semiconductor memory device, data is inputted from outside the device to write data registers $WR_1$ to $WR_n$ synchronized with the write clock WCK through write data bus WB/$\overline{WB}$. In this case, the data is inputted into the write data register selected by the write register pointer 11. On the one hand, data is read from read data registers $RR_1$ to $RR_n$ to outside the device in synchronization with the read clock RCK. The data of the read data register selected by the read register pointer 6 is transmitted to the read data bus RB.

Next will be described the data transfer operation for writing. FIG. 2A is a timing chart illustrating the data transfer operation from the write data register to the memory cell. The following description will focus on the operation of bit line pair $D_1/\overline{D_1}$ to be executed when word line $WL_1$ is selected. It is assumed that high-level data is stored in memory cell $C_{11}$, and data in reverse phase to this high-level data is stored in write data register $WR_1$.

Balance signal BL is first changed to a low level, and precharging of bit lines $D_1$ to $D_n$ and $\overline{D_1}$ to $\overline{D_n}$ is then halted to put these bit lines in a floating state. Next, word line $WL_1$ is turned to the high level. At this time, data stored in memory cell $C_{11}$ is transmitted as a minute difference voltage between bit lines $D_1$ and $\overline{D_1}$. However, by making write transfer signal WDTG shift to the high level for some fixed time, signals with the phase reverse to that of the data of memory cell $C_{11}$ will be transmitted from write data register $WR_1$ to bit line pair $D_1/\overline{D_1}$. Consequently, the data of write data register $WR_1$ is inputted into the sense amplifier 3 as a difference voltage between bit lines $D_1$ and $\overline{D_1}$. Thereafter, by making the sense amplifier activation signals SEP, SEN transit from reference voltage level Ref to the power source level and to the ground level, respectively, the electric potentials of bit lines $D_1$, $\overline{D_1}$ are amplified to the ground and power source potential levels, respectively and transmitted to memory cell $C_{11}$.

By changing word line $WL_1$ to the low level to finish the writing of data into memory cell $C_{11}$, and by concurrently changing balance signal BL to the high level to restart the precharging of each bit line, a series of the writing operation is completed. Although this description has been made with reference to memory cell $C_{11}$, memory cells $C_{12}$ to $C_{1n}$ are also connected to word line $WL_1$, and data are also stored in memory cells $C_{12}$ to $C_{1n}$ together with the storage of the data in memory cell $C_{11}$. The data to be stored in memory cells $C_{12}$ to $C_{1n}$ is the same as the data stored in each of write data registers $WR_2$ to $WR_n$.

Next will be described the data transfer operation for reading. FIG. 2B is a timing chart illustrating the data transfer operation from a memory cell to a read data register.

Balance signal BL is first changed to the low level, and precharging of bit lines $D_1$ to $D_n$ and $\overline{D}_1$ to $\overline{D}_n$ is then stopped to put these bit lines into a floating state. Word line $WL_1$ is then changed to the high level. As a result, the data held in memory cell $C_{11}$ is transmitted as a minute difference voltage between bit lines $D_1$ and $\overline{D}_1$ and inputted into the sense amplifier 3. By making sense amplifier activation signals SEP, SEN transit from the reference voltage level to the power source and ground levels, respectively, the electric potentials of bit lines $D_1$, $\overline{D}_1$ are amplified to the power source and ground levels, respectively. At this time, by making the read transfer signal RDTG shift to the high level for some fixed time, the data amplified by sense amplifier 3 is read out to read data register $RR_1$, and concurrently, this amplified data is transmitted again to memory cell $C_{11}$. By changing word line $WL_1$ to the low level, data reading from memory cell $C_{11}$ is finished. Since word line $WL_1$ is connected to memory cells $C_{12}$ to $C_{1n}$, the data is also refreshed in each of these memory cells $C_{12}$ to $C_{1n}$. Next, by changing balance signal BL to the high level to restart the precharging of each bit line $D_1$ to $D_n$ and $\overline{D}_1$ to $\overline{D}_n$, a series of reading operations is completed.

In FIFO type semiconductor memory devices with a basic structure of this type, it is not possible to directly designate an estimated address from outside in order to select a particular memory cell, so that when defects are detected or troubles are generated while developing a memory device itself or after it is assembled into a user's device, it is difficult to analyze the cause of the defects or troubles. Therefore, in many cases, a test circuit is provided in the memory device for easy analysis of defects and shortening the analysis time. For analysis of defects, it is important to discover whether the cause of the defects is in the memory cell or in the data register, it is consequently indispensable to provide as a function of the test circuit a bypass transfer function for direct transfer of data from a write data register to a read data register without passing through the memory cell.

The operation of transferring data from a write data register to a read data register will be described with reference to the semiconductor memory device shown in FIG. 1. FIG. 3 is a timing chart illustrating the bypass transfer operation of this semiconductor memory device. This bypass transfer operation corresponds to the read and write operation to be performed in succession.

Balance signal BL is first changed to the low level, and balancing and precharging of bit lines $D_1$ to $D_n$ and $\overline{D}_1$ to $\overline{D}_n$ are then stopped. Word line $WL_1$ is then turned to the high level, at which time, data stored in memory cell $C_{11}$ is transmitted as a minute difference voltage between bit lines $D_1$ and $\overline{D}_1$. Here, by shifting write transfer signal WDTG to the high level for some fixed time, the data stored in write data register $WR_1$ is inputted into bit lines $D_1$, $\overline{D}_1$. In an example shown in FIG. 3, the data stored in write data register $WR_1$ is of a phase that is the reverse of that of the data stored in memory cell $C_{11}$.

As a result, the data of write data register $WR_1$ is inputted into the sense amplifier 3 connected to bit line pair $D_1/\overline{D}_1$ as a voltage difference between bit lines $D_1$ and $\overline{D}_1$. Subsequently, by making sense amplifier activation signals SEP and SEN transit from the reference voltage level to the power source level and ground level, respectively, the electric potentials of bit lines $D_1$, $\overline{D}_1$ are amplified to the ground and power source voltage levels, respectively. At this time, read transfer signal RDTG is maintained at the high level for a certain fixed time, and consequently, the amplified data is read on read data register $RR_1$.

The data thus read out is identical to the data stored in write data register $WR_1$. Next, by changing word line $WL_1$ to the low level and balance signal BL to the high level and successively starting the balancing and precharging of bit lines $D_1$ to $D_n$ and $\overline{D}_1$ to $\overline{D}_n$, a series of bypass transfer operations is completed.

By the above operations, once the data of write data registers $WR_1$ to $WR_n$ has been transmitted to bit lines, it is amplified by the sense amplifier 3 and then transmitted as amplified data to read data registers $RR_1$ to $RR_n$, respectively. Therefore, when some irregularity in memory cell array 1 causes an abnormal voltage of the bit lines, the normal bypass transfer operation is disturbed, and as a result, it is difficult to clearly distinguish irregularities in the memory cell side from irregularities in the data register side. The conventional FIFO type semiconductor memory device described above is therefore problematic in that it does not allow an easy analysis of irregularities.

SUMMARY OF THE INVENTION

An object of the present invention is to provide a semiconductor memory device of FIFO type which can perform an easy analysis of an irregularity.

An object of the present invention is achieved by using a semiconductor memory device which comprises: a memory cell array composed of a plurality of memory cells arranged in the form of a matrix; a sense amplifier provided corresponding to said memory cell array; a write data register provided corresponding to said sense amplifier; write transfer means for transferring data from said write data register into said memory cell array; a read data register provided corresponding to said sense amplifier; read transfer means for transferring data from said memory cell array into said read data register; data storage means for storing data into said write data register; data read means for reading data from said read data register; and which is further characterized in that it has bypass switch means for directly transferring data from said write data register to said read data register.

An object of the present invention is also achieved by using a semiconductor memory device which comprises: a memory cell array composed of a plurality of memory cells arranged in the form of a matrix; a sense amplifier provided corresponding to said memory cell array; a write data register provided corresponding to said sense amplifier; write transfer means for transferring data from said write data register into said memory cell array; a read data register provided corresponding to said sense amplifier; read transfer means for transferring data from said memory cell into said read data register; data storage means for storing data into said write data register; data read means for reading data from said read data register; and further, data transfer switch means provided for connecting said read transfer means and said write transfer means to said memory cell array and said sense amplifier, said data transfer switch means transferring data directly from said write data register into said read data register.

The above and other objects, features and advantages of the present invention will become apparent from the following description referring to the accompanying drawings which illustrate examples of preferred embodiments of the present invention.

DETAILED DESCRIPTION OF THE PREFERRED EMBODIMENTS

Preferable embodiments of the present invention will be described with reference to the drawings.

Figure 1:
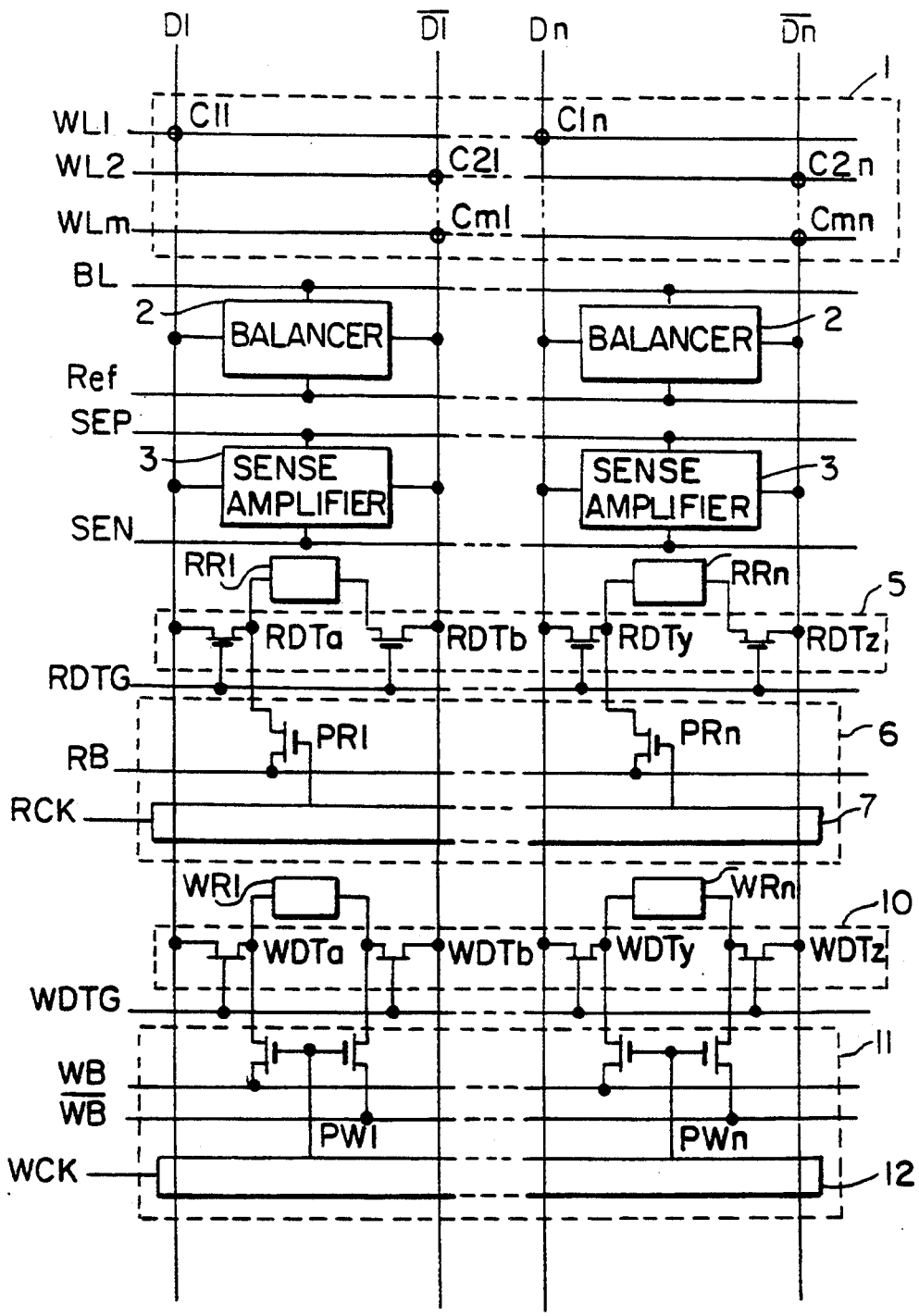
FIG. 1 is a block diagram showing the structure of a memory cell portion and a data register portion of a conventional semiconductor memory device.
Figure 2A:
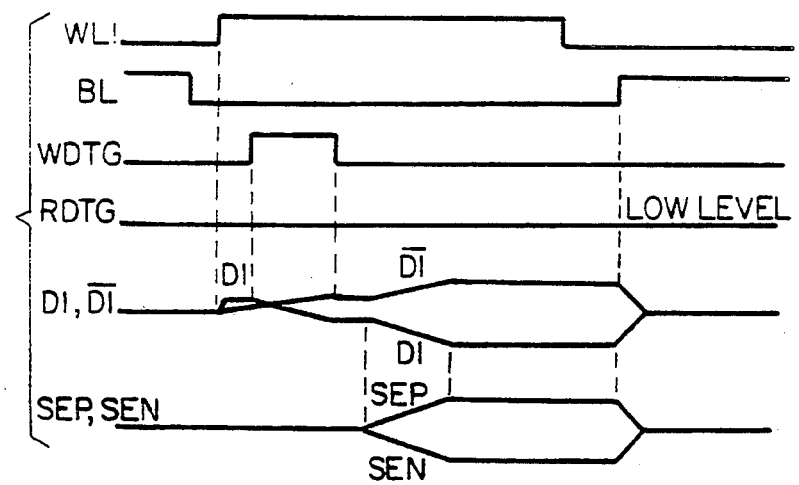
FIG. 2A is a timing chart showing the data transfer operation for writing of the semiconductor memory device of FIG. 1.
Figure 2B:
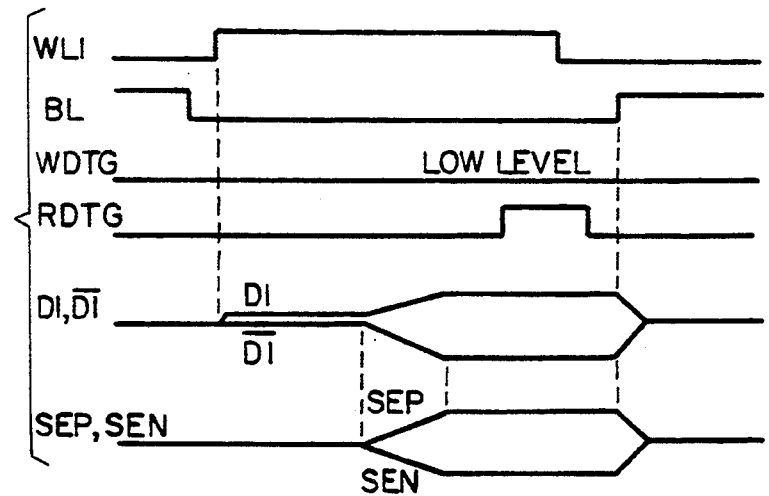
FIG. 2B is a timing chart showing the data transfer operation for reading of the semiconductor memory device of FIG. 1.
Figure 3:
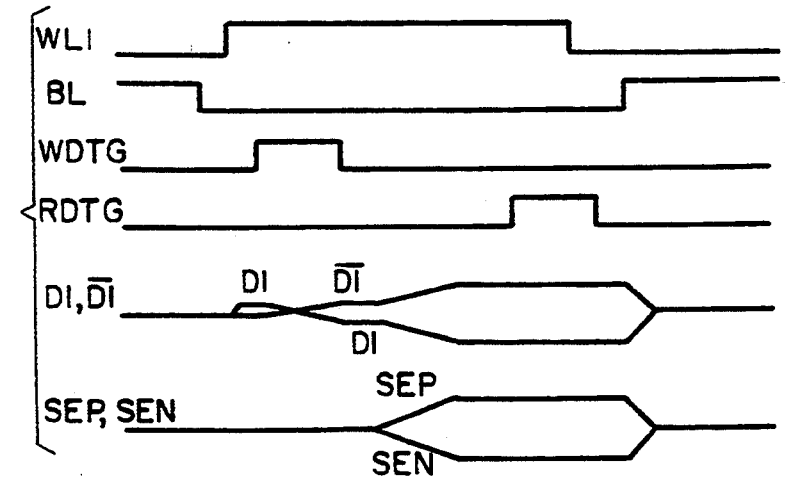
FIG. 3 is a timing chart showing the bypass data transfer operation of the semiconductor memory device of FIG. 1.
Figure 4:
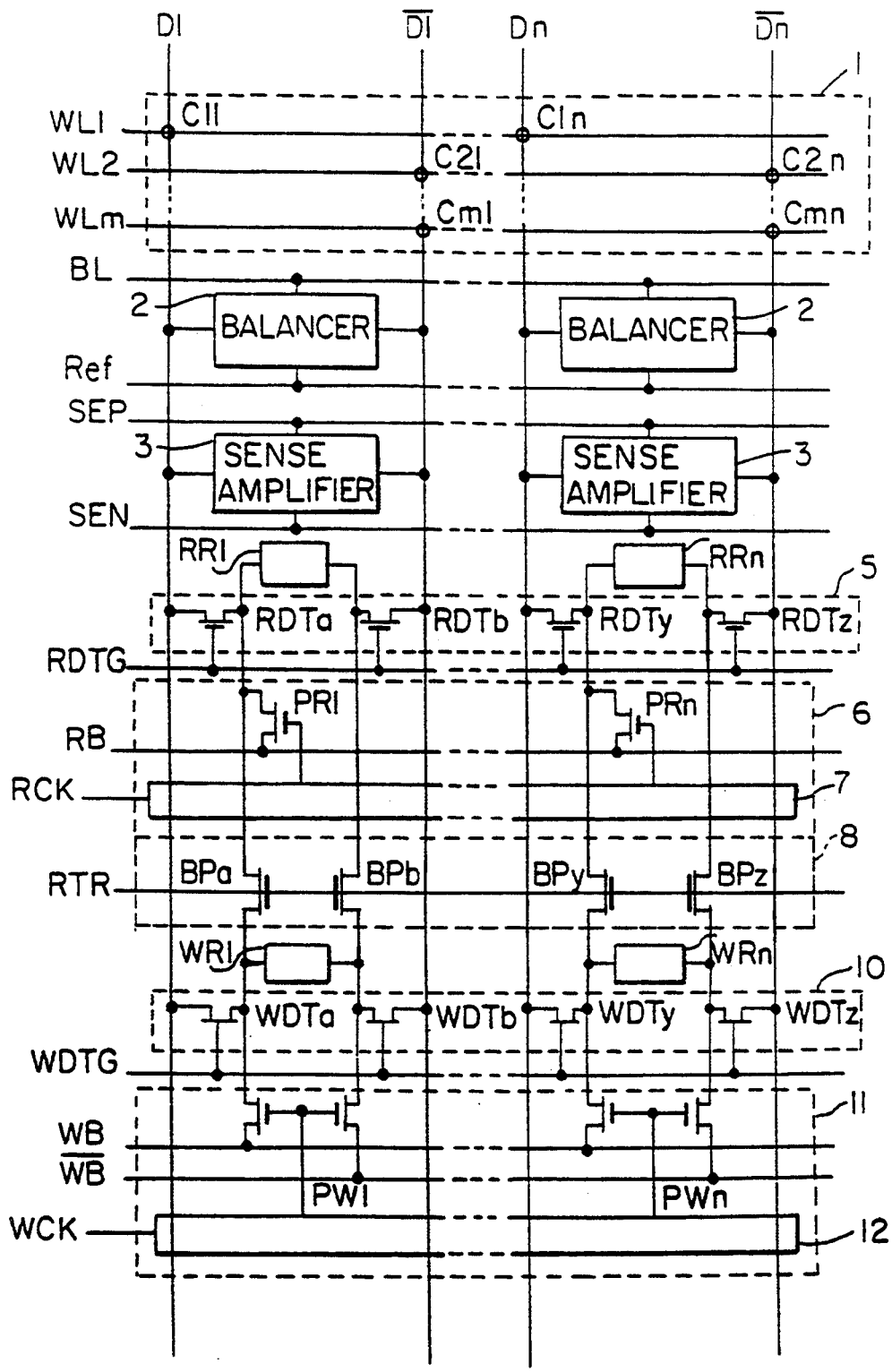
FIG. 4 is a block diagram showing the structure of a memory cell portion and data register portion of the semiconductor memory device of a first embodiment of the present invention.
Figure 5A:
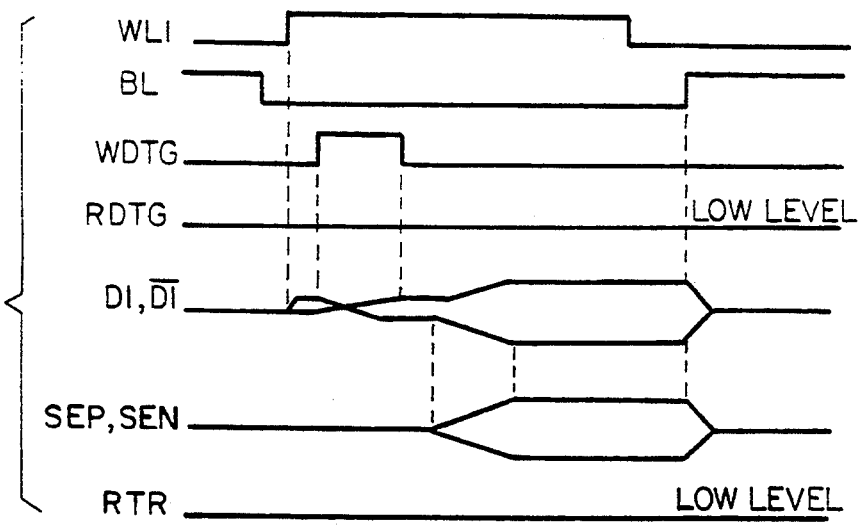
FIG. 5A is a timing chart showing the data transfer operation for writing of the semiconductor memory device of FIG. 4.
Figure 5B:
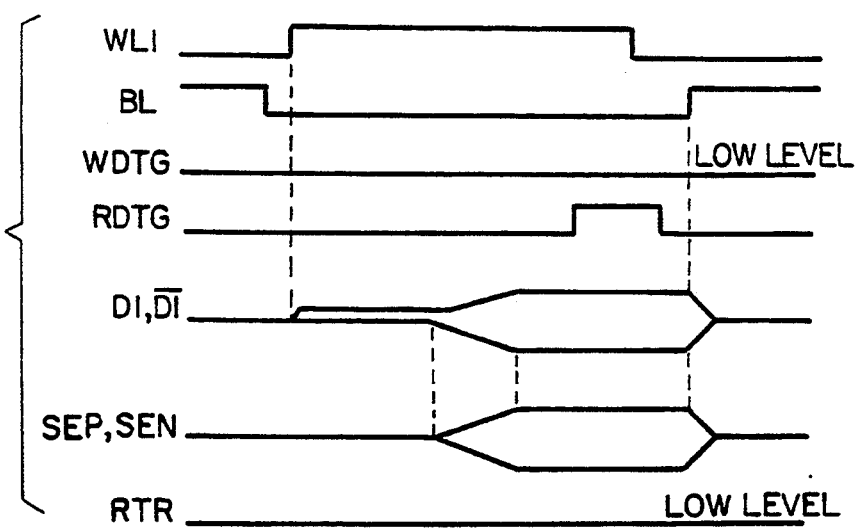
FIG. 5B is a timing chart showing the data transfer operation for reading of the semiconductor memory device of FIG. 4.
Figure 6:
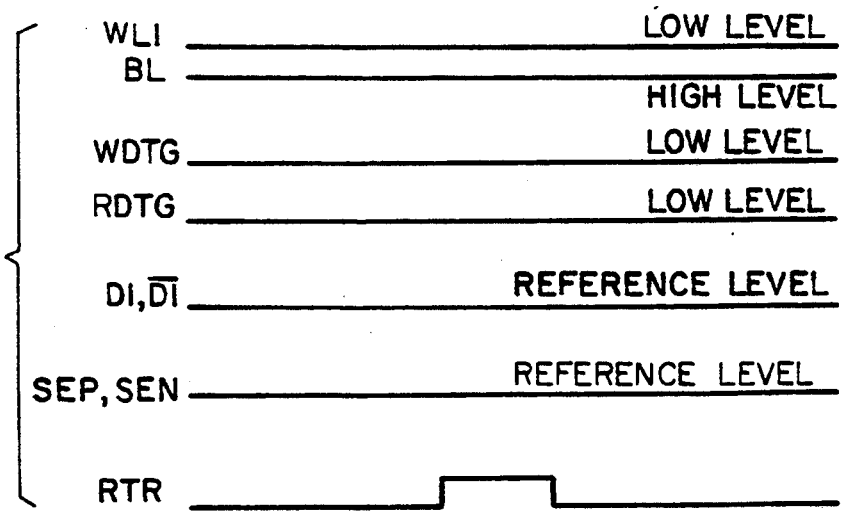
FIG. 6 is a timing chart showing the bypass data transfer operation of the semiconductor memory device of FIG. 4.

Description will first be made with reference to a semiconductor memory device of a first embodiment referring to FIGS. 4–6. The semiconductor memory device of FIG. 4 is constructed by providing additional bypass switches to the semiconductor memory device of FIG. 1.

In the semiconductor memory device, a memory cell array 1 of well-known structure is composed of memory cells $C_{11}$ to $C_{mn}$ of a dynamic type arranged in a form matrix of m rows and n columns. In the memory cell array 1 there are word lines $WL_1$ to $WL_n$ and bit line pairs $D_1/\overline{D}_1$ to $D_n/\overline{D}_n$, and the word lines are arranged perpendicular to the bit line pairs. Each word line $WL_1$ to $WL_n$ is provided for selecting a row in the memory cell array 1 and each bit line pair $D_1/\overline{D}_1$ to $D_n/\overline{D}_n$ is provided for reading and writing data from or into the memory cell which belongs to the row selected by the word line. Each memory cell $C_{11}$ to $C_{mn}$ is connected to one of the word lines and one of the bit lines.

Each of the bit line pairs $D_1/\overline{D}_1$ to $D_n/\overline{D}_n$ is provided with a balancer 2 and a sense amplifier 3. The balancer 2 receives balance signal BL and reference voltage Ref, and precharges the corresponding pair of bit lines to reference voltage Ref according to balance signal BL. During the precharging, there occurs no potential difference between pairs of bit lines, because these pairs of bit lines balance each other in the precharging state. The sense amplifier 3 is a widely known differential amplifier and is activated by changing sense amplifier activation signals SEP and SEN to the source voltage and ground voltage levels, respectively. In the activated state, the sense amplifier 3 amplifies the data transmitted to the bit lines. In order to change the sense amplifier 3 to a non-activated state, it is enough to turn both sense amplifier activation signals SEP and SEN to the reference voltage Ref level.

Bit line pairs $D_1/\overline{D}_1$ to $D_n/\overline{D}_n$ are provided with read data registers $RR_1$ to $RR_n$ and write data registers $WR_1$ to $WR_n$, respectively. Read registers are used for temporary storage of the data read from memory cells, and write registers are for temporary storage of the data to be inputted into memory cells.

Further, the semiconductor memory device comprises a read register switch 5, a read register pointer 6, a write register switch 10, a write register pointer 11 and a bypass switch 8. The read register switch 5 is composed of a number 2n of transfer gates $RDT_a$ to $RDT_z$. Each of these transfer gates consists of a MOSFET and connects each bit line pair $D_1/\overline{D}_1$ through $D_n/\overline{D}_n$ to a corresponding read data register $RR_1$ to $RR_n$ according to a read transfer signal RDTG commonly inputted to each transfer gate. For example, transfer gate $RDT_a$ connects bit line $D_1$ and one end of read data register $RR_1$, and transfer gate $RDT_b$ connects bit line $\overline{D}_1$ and the other end of read data register $RR_1$.

The read register pointer 6 consists of an n-stage shift register 7 for read and a number n of transfer gates $PR_1$ to $PR_n$. Each of these transfer gates $PR_1$ to $PR_n$ is composed of MOSFETs and is used to connect one read data register $RR_1$ through $RR_n$ to a respective read data bus RB corresponding to the output of the shift register 7. For example, transfer gate $PR_1$ is ON-OFF controlled by the output of a first stage of the shift register 7 to connect one end of read data register $RR_1$ and read data bus RB. The shift register 7 for read is arranged so as to operate in synchronization with the read clock RCK. The shift register is structured in such a way that only one output is activated from the outputs of each stage, and the others remain non-activated.

The write register switch 10 is composed of a number 2n of transfer gates $WDT_a$ to $WDT_z$. Each of these transfer gates is composed of MOSFETs and connects one bit line pair $D_1/\overline{D}_1$ to $D_n/\overline{D}_n$ to a respective write data register $WR_1$ to $WR_n$ corresponding to a write transfer signal WDTG inputted in common to the transfer gates. For example, transfer gate $WDT_a$ connects bit line $D_1$ and one end of write data register $WR_1$, and transfer gate $WDT_b$ connects bit line $\overline{D}_1$ and the other end of write data register $WR_1$.

The write register pointer 11 consists of an n-stage shift register 12 for write and n pairs of transfer gates $PW_1$ to $PW_n$. Each transfer gate $PW_1$ to $PW_n$ is composed of a pair of MOSFETs and is used to connect one of write data registers $WR_1$ through $WR_n$ to write data bus $WB/\overline{WB}$ corresponding to the output of the write shift register 11. Write data bus $WB/\overline{WB}$ is composed of a pair of write data lines WB and $\overline{WB}$. Write data lines WB and $\overline{WB}$ are arranged so as to receive signals having phases in reverse to each other. For example, transfer gate $PW_1$ is controlled by the output of a first stage of shift register 11 to connect one end of write data register $WR_1$ and write data line WB and also to connect the other end of write data register $WR_1$ and write data line $\overline{WB}$. The shift register 11 for write is made so as to operate in synchronization with the write clock WCK. The shift register is structured in such a way that only one output is activated from among the outputs of each stages while the others remain non-activated.

The By-pass switch 8 is composed of a number 2n of transfer gates $BP_a$ to $BP_z$. Each transfer gate comprises a MOSFET or the like and is arranged so as to be ON-OFF controlled by a bypass transfer signal RTR inputted thereto in common. Each transfer gate connects the corresponding read data register and a write data register for each column of the memory cell array 1. In other words, transfer gate $BP_a$ connects one end of read data register $RR_1$ and one end of write data register $WR_1$, and transfer gate $BP_b$ connects the other end of read data register $RR_1$ and the other end of write data register $WR_1$. In the same way as above, transfer gate $BP_y$ connects one end of read data register $RR_n$ and one end of write data register $WR_n$, and transfer gate $BP_z$ connects the other end of read data register $RR_n$ and the other end of write data register $WR_n$.

In this semiconductor memory device, writing of the data from outside the device to write data registers $WR_1$ to $WR_n$ is performed through write data bus $WB/\overline{WB}$ in synchronization with the write clock WCK. In this case, data is stored with every clock pulse of the write clock WCK in the write data register indicated by the shift register 12 for write. The data stored in each of write data registers $WR_1$ to $WR_n$ is inputted in block into the memory cell of the row selected from the memory cell array 1 by the later-described transfer operation for write.

On the one hand, when data is read, data is transmitted in block from a memory cell of the row selected to read data registers $RR_1$ to $RR_n$ by the later-described transfer operation for read. Reading of the data stored in read data registers $RR_1$ to $RR_n$ to outside the device is carried out in synchronization with the read clock RCK. In this case, the data of read data register indicated by the shift register 7 for read is transmitted to read data bus at intervals of one clock pulse of the read clock RCK.

The transfer operation for write will first be described. FIG. 5A is a timing chart illustrating the write data transfer operation. In the following description, attention will be paid to the operation of bit line pair $D_1/\overline{D}_1$ to be executed when word line $WL_1$ is selected. Also, it is assumed that high-level data is held in memory cell $C_{11}$, and data of a phase in reverse thereto is held in write data register $WR_1$.

During the write transfer operation, bypass transfer signal RTR is always held in the low level. Accordingly, each transfer gate of the bypass switch 8 is constantly held in the OFF state.

Balance signal BL is first changed to the low level, and precharging of bit lines $D_1$ to $D_n$ and $\overline{D}_1$ to $\overline{D}_n$ is then stopped to put these bit lines into a floating state. Next, word line $WL_1$ is turned to the high level, at which time, a minute difference in voltage is generated between bit lines $D_1$ and $\overline{D}_1$ due to the data stored in memory cell $C_{11}$. Here, by making write transfer signal WDTG shift to the high level for a fixed time, signals with phase in reverse to that of the data of memory cell $C_{11}$ will be transmitted from write data register $WR_1$ to a pair of bit lines $D_1$, $\overline{D}_1$. As a result, the data of write data register $WR_1$ is inputted into sense amplifier 3 as the voltage difference between bit lines $D_1$ and $\overline{D}_1$. Thereafter, by causing sense amplifier activation signals SEP and SEN to transit from reference voltage level Ref to a power source level and ground level, respectively, the electric potential of bit lines $D_1$ and $\overline{D}_1$ will be amplified to the ground and power source potential levels, respectively, and transmitted to memory cell $C_{11}$. Since memory cell $C_{11}$ has been switched to a selected state due to the action of word line $WL_1$, it will be charged in accordance with the voltage of bit line $D_1$, and thus, the data will be stored into memory cell $C_{11}$.

By changing word line $WL_1$ to the low level and finishing the writing of data into memory cell $C_{11}$, and by concurrently changing balance signal BL to the high level and restarting the precharging of each bit line, a series of writing operations is completed. Although description has been made here with reference to memory cell $C_{11}$, memory cells $C_{12}$ to $C_{1n}$ are also connected to word line $WL_1$, and data is also stored in memory cells $C_{12}$ to $C_{1n}$ together with the storing of the data in memory cell $C_{11}$. The data to be stored in memory cells $C_{12}$ to $C_{1n}$ is equal to the data stored in write data registers $WR_2$ to $WR_n$, respectively.

Next, the data transfer operation for read will be described. FIG. 5B is a timing chart illustrating the read data transfer operation.

Balance signal BL is first changed to the low level, and precharging of bit lines $D_1$ to $D_n$ and $\overline{D}_1$ to $\overline{D}_n$ is then stopped to put these bit lines into a floating state. Next, word line $WL_1$ is turned to the high level. As a result, a minute difference in voltage is produced between bit lines $D_1$ and $\overline{D}_1$ due to the data held in memory cell $C_{11}$ and inputted into the sense amplifier 3. Thereafter, by making sense amplifier activation signals SEP and SEN transit from the reference potential level to a power source level and ground level, respectively, the electric potential of bit lines $D_1$ and $\overline{D}_1$ is amplified to the power source and ground levels, respectively, at which time, by shifting read transfer signal RDTG to the high level for a fixed time, the data amplified by the sense amplifier 3 is read out to read data register $RR_1$, and this amplified data is concurrently transmitted again to memory cell $C_{11}$. Upon turning word line $WL_1$ to the low level, data reading from memory cell $C_{11}$ is completed. Since word line $WL_1$ is connected to memory cells $C_{12}$ to $C_{1n}$, the data in these memory cells $C_{12}$ to $C_{1n}$ is also read to read data registers $RR_2$ to $RR_n$ and restored therein. Thereafter, by changing balance signal BL to the high level and, in addition, starting the precharging of each bit line $D_1$ to $D_n$ and $\overline{D_1}$ to $\overline{D_n}$, a series of reading operations is completed.

Next, description will be made with reference to the bypass data transfer operation of the semiconductor memory device. FIG. 6 is a timing chart illustrating the transfer operation using a bypass.

When data is transferred through the bypass, each of the word lines $WL_1$ to $WL_n$ is in a non-selected state, balancer signal BL is in the activated state (high level) and each of the bit lines $D_1$ to $D_n$ and $\overline{D_1}$ to $\overline{D_n}$ is in the precharged state. Further, read transfer signal RDTG and write transfer signal WDTG are in a non-active state (low level), and each of the read data registers $RR_1$ to $RR_n$ and write data registers $WR_1$ to $WR_n$ is in a state electrically disconnected from each of the bit line pairs $D_1/\overline{D_1}$ to $D_n/\overline{D_n}$. The sense amplifier 3 is also in a non-activated state.

Bypass transfer signal RTR is then turned to the high level for a fixed time, and accordingly, each transfer gate $BP_a$ to $BP_z$ of the bypass switch 8 turns to the ON state, and the data held in each write data register $WR_1$ to $WR_n$ is transmitted to each read data register $RR_1$ to $RR_n$. That is, data is transmitted from a write data register to a read data register without passing through a sense amplifier or a bit line. Accordingly, it is thereby possible to divide irregularities of the memory cell from irregularities of the data register to enable easy analysis of the irregularities.

Figure 7:
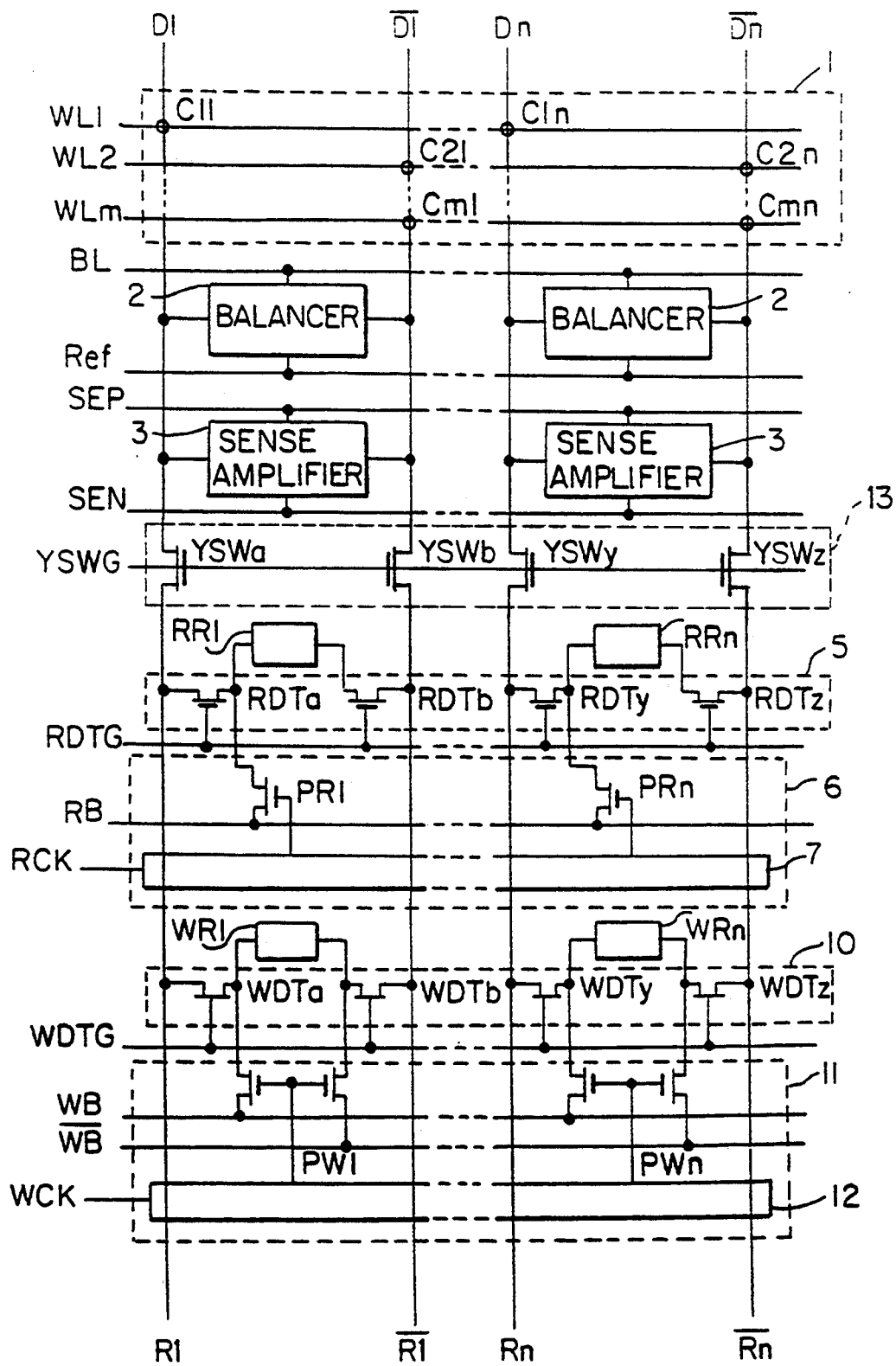
FIG. 7 is a block diagram showing the structure of a memory cell portion and data register portion of the semiconductor memory device of a second embodiment of the present invention.

Next will be described a second embodiment of the present invention. FIG. 7 is a block diagram showing the structure of a semiconductor memory device of the embodiment. This semiconductor memory device differs from the one shown in FIG. 4 in that it does not include a bypass transfer switch but includes a data transfer switch provided at each bit line and bisecting the bit line. Components in FIG. 7 having the same function as components in FIG. 4 are marked with the same reference symbol.

The data transfer switch 13 is composed of a number 2n of transfer gates $YSW_a$ to $YSW_z$, and each of these transfer gates is composed of a MOSFET and is ON-OFF controlled by a data transfer signal YSWG.

N pairs of bit lines $D_1/\overline{D_1}$ to $D_n/\overline{D_n}$ pass through the memory cell array 1, and a balancer 2 and sense amplifier 3 are connected to each bit line pair. Bit lines $D_1$, $\overline{D_1}$ to $D_n$, $\overline{D_n}$ are connected to bit lines $R_1$, $\overline{R_1}$ to $R_n$, $\overline{R_n}$, respectively, through respective transfer gates $YSW_a$ to $YSW_z$. Respective bit line pairs $R_1/\overline{R_1}$ to $R_n/\overline{R_n}$ are connected to respective read data registers $RR_1$ to $RR_n$ through a read register switch 5, and to respective write data registers $WR_1$ to $WR_n$ through a write register switch 10. The read register switch 5 and write register switch 6 are controlled by a read register pointer 6 and a write register pointer 11, respectively, in the same manner as in the above embodiment.

In this semiconductor memory device, writing of the data from outside the device to write data registers $WR_1$ to $WR_n$ is performed in synchronization with a write clock WCK through write data bus WB/$\overline{WB}$. In this case, data is stored with each clock pulse of the write clock WCK in the write data register indicated by the shift register 12 for write. The data stored in each of write data registers $WR_1$ to $WR_n$ is inputted in block into the memory cells of the row selected from the memory cell array 1 by the later-described write data transfer operation, while each of the transfer gates $YSW_a$ to $YSW_z$ of the data transfer switch 13 is maintained in the ON state.

On the one hand, when data is read, the data is transmitted in block from memory cells of the row selected by the later-described read transfer operation to read data registers $RR_1$ to $RR_n$, while respective transfer gates $YSW_a$ to $YSW_z$ of the data transfer switch 13 are held in the ON state. Reading of the data stored in read data registers $RR_1$ to $RR_n$ to outside the device is carried out in synchronization with the read clock RCK. In this case, the data of the read data register indicated by the shift register 7 for read is transmitted with every clock pulse of the read clock RCK to the read data bus.

Figure 8:
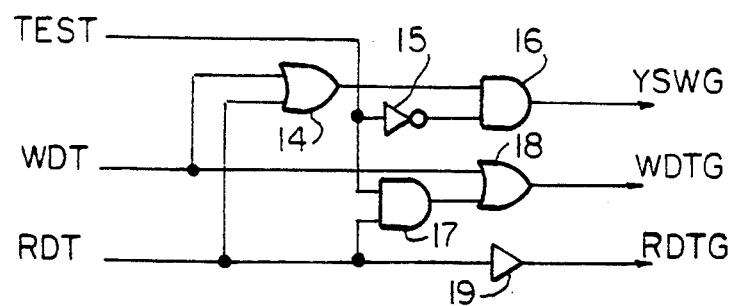
FIG. 8 is a block diagram showing the structure of a controller used for realizing the bypass data transfer of the semiconductor memory device of FIG. 7.

Here, a control circuit for producing transfer signals YSWG, WDTG and RDTG will be described with reference to FIG. 8.

This control circuit consists of two OR gates 14 and 18, two AND gates 16 and 17, an inverter 15 and a buffer 19. Read designation signal RDT, write designation signal WDT and test signal TEST are inputted into the control circuit. The first OR gate 14 calculates and outputs the Boolean ADD of each designation signal RDT and WDT. The inverter 15 inverts test signal TEST, and the first AND gate 16 calculates a logical product (AND) of outputs of the first OR gate 14 and inverter 15 and outputs it as data transfer signal YSWG. Second AND gate 17 calculates a logical product of test signal TEST and read designation signal RDT, and second OR gate calculates Boolean ADD of the output of second AND gate 17 and write designation signal WDT and outputs it as write transfer signal WDTG. The buffer 19 outputs read designation signal RDT without change as read transfer signal RDTG.

With a control circuit constructed in this way, when signal TEST is in the low level and one of designation signals WDT, RDT is in the high level, the level of data transfer signal YSWG becomes high, and the level of either write transfer signal WDTG or read transfer signal RDTG also becomes high corresponding to each designation signal. When signal TEST changes to the high level, data transfer signal YSWG turns to the low level, and further, when read designation signal RDT is put in the high level for a fixed time, read transfer signal RDTG and write transfer signal WDTG turn to the high level for the same fixed time.

Figure 9A:
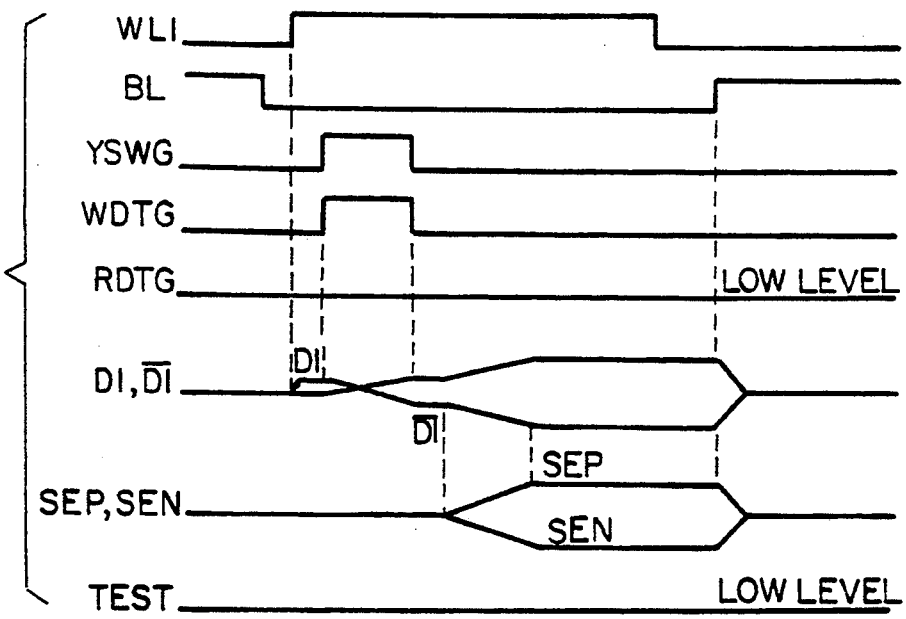
FIG. 9A is a timing chart showing the data transfer operation for writing of the semiconductor memory device of FIG. 7.

Next will be described a write transfer operation. FIG. 9A is a timing chart illustrating the write data transfer operation. In the following description, attention will be paid to the operation of bit line pair $D_1/\overline{D_1}$ to be executed when word line $WL_1$ is selected. It is assumed that data of the high level is held in memory cell $C_{11}$, and data of a phase in reverse thereto is held in write data register $WR_1$.

The write transfer operation is carried out while TEST signal is held in the low level. Balance signal BL is first changed to the low level, and precharging of bit lines $D_1$ to $D_n$ and $\overline{D_1}$ to $\overline{D_n}$ is then stopped to put these bit lines in the floating state. Word line $WL_1$ is turned to the high level, at which time, a minute difference in voltage is generated between bit lines $D_1$ and $\overline{D_1}$ due to the data stored in memory cell $C_{11}$. In this state, since each designation signal WDT, RDT will be in the low level, each transfer signal YSWG, RDTG and WDTG will also be in the low level. Here, by shifting write designation signal WDT to the high level for a fixed time, data transfer signal YSWG and write transfer signal WDTG will also turn to the high level, and data transfer switch 13 and read register switch 5 will switch to a conductive state, and as a result, signals of a phase in reverse to that of the data of memory cell $C_{11}$ will be transmitted from write data register $WR_1$ to bit line pair $D_1/\overline{D_1}$. As a result, the data of write data register $WR_1$ is inputted into the sense amplifier 3 as the difference in voltage between bit lines $D_1$ and $\overline{D_1}$.

Thereafter, by making sense amplifier activation signals SEP and SEN transit from reference voltage level Ref to a power source level and ground level, respectively, the electric potential of bit lines $D_1$ and $\overline{D_1}$ is amplified to the ground and power source potential levels, respectively, and transmitted to memory cell $C_{11}$. Since memory cell $C_{11}$ has been turned to the selected state due to the action of word line $WL_1$, the cell is charged in accordance with the voltage of bit line $D_1$, and thus, the data is stored into memory cell $C_{11}$.

By switching word line $WL_1$ to the low level and completing the writing of data into memory cell $C_{11}$, and by concurrently shifting balance signal BL to the high level to restart the precharging of each bit line, a series of writing operation is completed. Although description has been made here with reference to memory cell $C_{11}$, memory cells $C_{12}$ to $C_{1n}$ are also connected to word line $WL_1$ such that the data is also stored in memory cells $C_{12}$ to $C_{1n}$ along with the storage of the data in memory cell $C_{11}$. The data to be stored in memory cells $C_{12}$ to $C_{1n}$ is the same as that stored in write data registers $RR_2$ to $RR_n$.

Figure 9B:
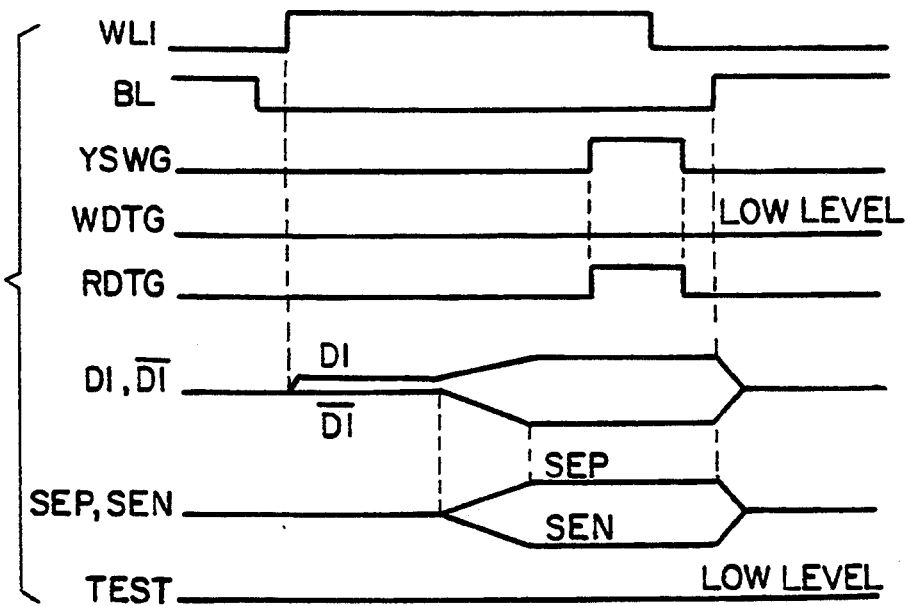
FIG. 9B is a timing chart showing the data transfer operation for reading of the semiconductor memory device of FIG. 7.

Next will be described the data transfer operation for read. FIG. 9B is a timing chart illustrating the read data transfer operation.

During the read transfer operation, the signal TEST is constantly kept in the low level. It is assumed that each designation signal RDT and WDT is in the low level in the initial state. Balance signal BL is first changed to the low level, and precharging of bit lines $D_1$ to $D_n$ and $\overline{D_1}$ to $\overline{D_n}$ is then stopped to put these bit lines into a floating state. Word line $WL_1$ is then turned to the high level. As a result, a minute difference in voltage is produced between bit lines $D_1$ and $\overline{D_1}$ due to the data held in memory cell $C_{11}$ and inputted into the sense amplifier 3, following which, by causing sense amplifier activation signals SEP and SEN to transit from the reference electric potential level to a power source level and ground level, respectively, the electric potential of bit lines $D_1$ and $\overline{D_1}$ is amplified to the power source and ground levels, respectively.

By shifting read designation signal RDT to the high level for a fixed time, data transfer signal YSWG and read transfer signal RDTG turn to the high level for the same fixed time. As a result, the data amplified by the sense amplifier 3 is read out to read data register $RR_1$, and this amplified data is concurrently transmitted again to memory cell $C_{11}$, following which, by switching word line $WL_1$ to the low level, data reading from memory cell $C_{11}$ is completed. Since word line $WL_1$ is also connected to memory cells $C_{12}$ to $C_{1n}$, the data in these memory cells $C_{12}$ to $C_{1n}$ are read to read data registers $RR_2$ to $RR_n$ where it is stored again. Thereafter, by shifting balance signal BL to the high level to restart the precharging of each bit lines $D_1$ to $D_n$ and $\overline{D_1}$ to $\overline{D_n}$, a series of reading operations is completed.

Figure 10:
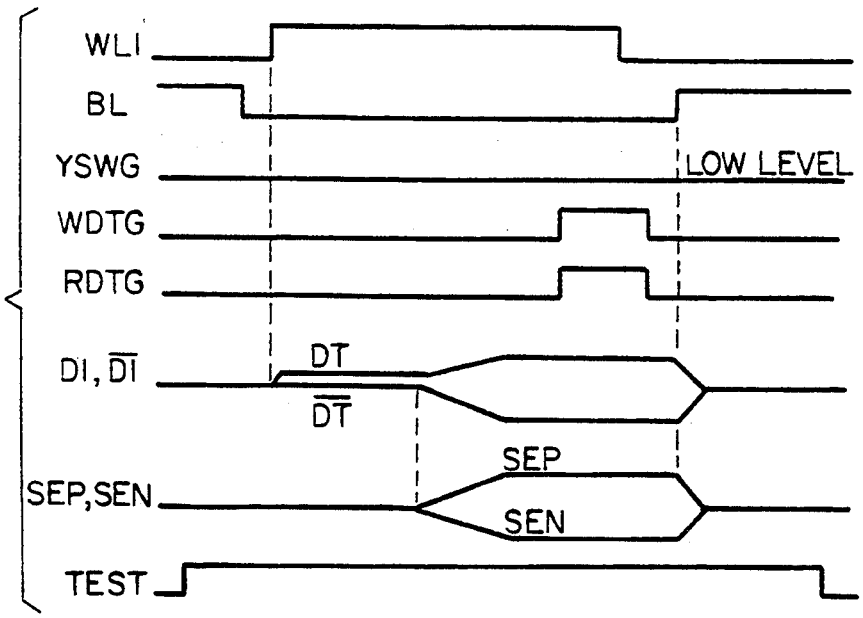
FIG. 10 is a timing chart showing the bypass data transfer operation of the semiconductor memory device of FIG. 7.

Next will be described the operation of bypass data transfer. FIG. 10 is a timing chart illustrating the bypass transfer operation.

During the bypass transfer operation, the signal TEST is kept in the high level. Each designation signal WDT and RDT is held in the low level in the initial state. Balance signal BL is first changed to the low level, and precharging of bit lines $D_1$ to $D_n$ and $\overline{D_1}$ to $\overline{D_n}$ is then stopped. Next, word line $WL_1$ is turned to the high level. As a result, a minute difference in voltage is produced between bit lines $D_1$ and $\overline{D_1}$ due to the data held in memory cell $C_{11}$ and inputted into the sense amplifier 3.

By causing sense amplifier activation signals SEP and SEN to transit from the reference voltage level to the power source voltage level and ground level, respectively, the electric potential of bit lines $D_1$ and $\overline{D_1}$ is amplified to the power source and ground voltage levels, respectively. Since data transfer signal YSWG is now in the low level, data transfer switch 13 is OFF, and bit lines $D_1$ to $D_n$, $\overline{D_1}$ to $\overline{D_n}$ on the memory cell side and bit lines $R_1$ to $R_n$, $\overline{R_1}$ to $\overline{R_n}$ on the data register side are electrically disconnected.

Here, when read designation signal RDT turns to the high level for a fixed time, data transfer signal YSWG remains at the low level and read transfer signal RDTG and write transfer signal WDTG shift to the high level only for the same fixed time. As a result, the data transfer switch 13 remains unchanged in the OFF state, and the read register switch 5 and write register switch 10 turn to the ON state, and consequently the data held in write data register $WR_1$ is outputted to bit lines $R_1$ and $\overline{R_1}$ and read out to the read data register $RR_1$. In the same way, the data stored in write data registers $WR_2$ to $WR_n$ is read out to read data registers $RR_2$ to $RR_n$, respectively. The data amplified by the sense amplifier 3 is then transmitted to memory cell $C_{11}$ to refresh it. In the same manner, memory cells $C_{12}$ to $C_{1n}$ are also refreshed. By turning word line $WL_1$ to the low level, the data store operation to each memory cell $C_{11}$ to $C_{1n}$ is finished. Further, by turning balance signal BL to the high level to restart the precharging of each bit lines $D_1$ to $D_n$ and $\overline{D_1}$ to $\overline{D_n}$, the bypass transfer operation is completed.

In the bypass transfer operation described above, the refreshing operation of memory cells is conducted simultaneously with the data transfer from the write data registers to the read data registers. However, since the data transfer switch 13 is in the OFF state, the refreshing operation and bypass operation are conducted independently of each other. In other words, the data transmitted by the bypass transfer operation does not pass through any of the memory cells, sense amplifiers, or bit lines $D_1$, $\overline{D_1}$ to $D_n$, $\overline{D_n}$.

Figure 11:
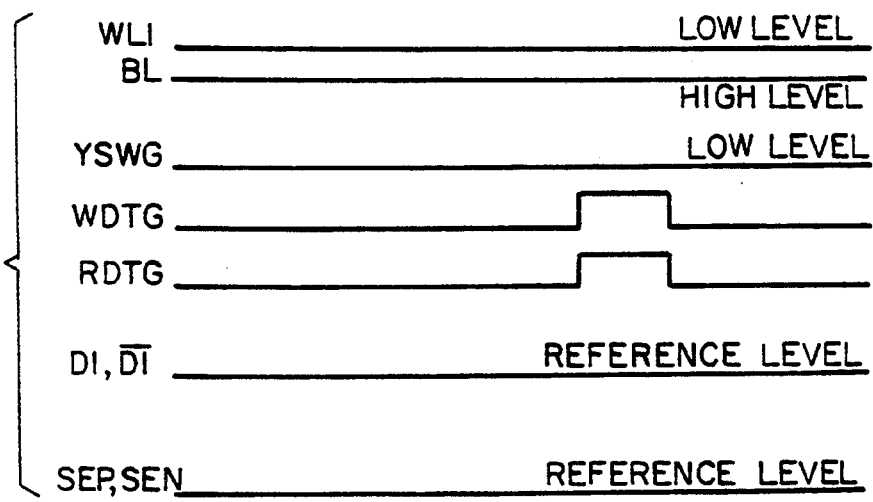
FIG. 11 is a timing chart showing another mode of the bypass data transfer of the semiconductor memory device of FIG. 7.

Further, it is possible to carry out only the bypass transfer operation without performing the refreshing operation of each memory cell. FIG. 11 is a timing chart for case in which only the bypass transfer operation is performed.

During the bypass transfer operation, word line $WL_1$ is constantly in the non-active level (low level), signal TEST and balance signal BL are always in the high level, and sense amplifier activation signals SEP and SEN are in the non-activated level (reference voltage level). Consequently, each of the bit lines $D_1$, $\overline{D_1}$ to $D_n$, $\overline{D_n}$ is constantly kept in a state precharged to reference voltage level Ref. The sense amplifier 3 does not work during the bypass transfer operation. The data transfer switch 13 is then kept in the OFF state.

In this state, by turning read designation signal RDT to the high level for a fixed time, read transfer signal RDTG and write transfer signal WDTG are turned to the high level for the same fixed time, and the data of write data registers $WR_1$ to $WR_n$ is read out to read data registers $RR_1$ to $RR_n$, respectively.

Also in the second embodiment, it is possible to realize the bypass transfer of the data without passing through the sense amplifier or bit line. In this case, since the data transfer switch 13 is only connected to bit lines $D_1$ to $D_n$ and $\overline{D_1}$ to $\overline{D_n}$, there is an advantage that the system can be operated without increasing the capacity of bit lines.

It is to be understood that variations and modifications of the semiconductor memory device disclosed herein will be evident to one skilled in the art. It is intended that all such modifications and variations be included within the scope of the appended claims.

What is claimed is:

1. A semiconductor memory device, comprising:
   a memory cell array comprising a plurality of memory cells arranged in the form of a matrix;
   a sense amplifier provided corresponding to said memory cell array;
   a write data register provided corresponding to said sense amplifier;
   write transfer means for transferring data from said write data register into said memory cell array;
   a read data register provided corresponding to said sense amplifier;
   read transfer means for transferring data from said memory cell array into said read data register;
   data storage means for storing data into said write data register;
   data read means for reading data from said read data register; and
   bypass switch means for electrically connecting said write data register to said read data register to directly transfer data from said write data register to said read data register.

2. A semiconductor memory device according to claim 1, wherein said write data register is interposed between two bit lines which compose bit line pair.

3. A semiconductor memory device according to claim 2, wherein said read data register is interposed between two bit lines which compose bit line pair.

4. A semiconductor memory device according to claim 3, wherein,
   said bypass switch means is composed of two transfer gates, one of said transfer gates connecting one end of said read data register and one end of said write data register, and the other one of said transfer gates connecting the other end of said read data register and the other end of said write data register.

5. A semiconductor memory device according to claim 1, wherein said bypass switch means connects said write data register to said read data register corresponding to a transfer signal input from outside said semiconductor memory device, and said transfer signal is transmitted in common to each said bypass switch means.

6. A semiconductor memory device according to claim 4, wherein said bypass switch means connects said write data register to said read data register corresponding to a transfer signal input from outside said semiconductor memory device, and said transfer signal is transmitted in common to each said bypass switch means.

7. A semiconductor memory device according to claim 4, wherein said data read means reads data sequentially from each read data register in synchronization with a read clock.

8. A semiconductor memory device according to claim 4, wherein said data storage means stores data sequentially in each write data register in synchronization with a write clock.

9. A semiconductor memory device, comprising:
   a memory cell array composed of a plurality of memory cells arranged in the form of a matrix;
   a sense amplifier provided corresponding to said memory cell array;
   a write data register provided corresponding to said sense amplifier;
   write transfer means for transferring data from said write data register into said memory cell array;
   a read data register provided corresponding to said sense amplifier;
   read transfer means for transferring data from said memory cell into said read data register;
   data storage means for storing data into said write data register;
   data read means for reading data from said read data register; and
   data transfer switch means provided for connecting said read transfer means and said write transfer means to said memory cell array and said sense amplifier, said data transfer switch means transferring data directly from said write data register into said read data register.

10. A semiconductor memory device according to claim 9, wherein said write data register is interposed between two bit lines composing bit line pair.

11. A semiconductor memory device according to claim 10, wherein said read data register is interposed between two bit lines composing bit line pair.

12. A semiconductor memory device according to claim 11, wherein,
    each said data transfer switch means is composed of two transfer gates,
    each of said transfer gates bisects each bit line of said bit line pairs.

13. A semiconductor memory device according to claim 12, wherein said data transfer switch means interconnects both portions bisected thereby corresponding to a transfer signal input from outside said semiconductor memory device, and said transfer signal is input in common into each said data transfer switch means.

14. A semiconductor memory device according to claim 12, wherein said data read means reads data sequentially from each read data register in synchronization with a read clock.

15. A semiconductor memory device according to claim 12, wherein said data storage means stores data sequentially in each write data register in synchronization with a write clock.

* * * * *

UNITED STATES PATENT AND TRADEMARK OFFICE
CERTIFICATE OF CORRECTION

PATENT NO. : 5,371,708
DATED : December 6, 1994
INVENTOR(S) : Kobayashi

It is certified that error appears in the above-indentified patent and that said Letters Patent is hereby corrected as shown below:

Column 1, line 33, delete "$D_1/D_1$ to $D_n/D_n$" insert --$D_1/\overline{D_1}$ to $D_n/\overline{D_n}$--.

Column 1, line 37, after "and" delete "$D_1$ to $D_n$" insert --$\overline{D_1}$ to $\overline{D_n}$--.

Column 1, line 38, delete "$D_1/D_n$ to $D_n/D_n$" insert --$D_1/\overline{D_1}$" to --$D_n/\overline{D_n}$--.

Column 1, line 46, delete "$D_1/D_1$ to $D_n/D_n$" insert --$D_1/\overline{D_1}$ to $D_n/\overline{D_n}$--.

Column 1, line 54, delete "$D_1/D_1$ to $D_n/D_n$" insert --$D_1/\overline{D_1}$ to $D_n/\overline{D_n}$--.

Column 1, line 59, delete "$D_1$" insert --$\overline{D_1}$--.

Column 2, lines 8 & 9, delete "$D_1/D_1$ to --$D_n/D_n$" insert --$D_1/\overline{D_1}$ to --$D_n/\overline{D_n}$--.

Column 2, line 14, delete "$D_1$" insert --$\overline{D_1}$--.

Column 2, line 44, delete "$D_1/D_1$" insert --$D_1/\overline{D_1}$--.

Column 2, line 50, after "and" delete "$D_1$ to $D_n$" insert --$\overline{D_1}$ to $\overline{D_n}$--.

Column 2, line 54, after "and" delete "$D_1$" insert --$\overline{D_1}$--.

Column 2, line 59, delete "$D_1/D_1$" insert --$D_1/\overline{D_1}$--.

UNITED STATES PATENT AND TRADEMARK OFFICE
CERTIFICATE OF CORRECTION

PATENT NO.  : 5,371,708
DATED       : December 6, 1994
INVENTOR(S) : Kobayashi

It is certified that error appears in the above-indentified patent and that said Letters Patent is hereby corrected as shown below:

Column 2, line 62, after "and" delete "$D_1$" insert --$\overline{D_1}$--.

Column 2, line 66, delete "$D_1$, $D_1$" insert --$D_1$, $\overline{D_1}$--.

Column 3, line 18, after "and" delete "$D_1$ to $D_n$" insert --$\overline{D_1}$ to $\overline{D_n}$--.

Column 3, line 22, after "and" delete "$D_1$" insert --$\overline{D_1}$--.

Column 3, line 27, delete "$D_1$, $D_1$" insert --$D_1$, $\overline{D_1}$--.

Column 3, line 39, after "and" delete "$D_1$ to $D_n$" insert --$\overline{D_1}$ to --$\overline{D_n}$--.

UNITED STATES PATENT AND TRADEMARK OFFICE
CERTIFICATE OF CORRECTION

PATENT NO. : 5,371,708
DATED : December 6, 1994
INVENTOR(S) : Kobayashi

Page 3 of 7

It is certified that error appears in the above-indentified patent and that said Letters Patent is hereby corrected as shown below:

Column 3, lines 65 & 66, after "and" delete "$D_1$ to $D_n$" insert --$\overline{D_1}$ to $\overline{D_n}$--.

Column 4, line 1, after "and" delete "$D_1$" insert --$\overline{D_1}$--.

Column 4, line 4, delete "$D_1$, $D_1$" insert --$D_1$, $\overline{D_1}$--.

Column 4, line 10, delete "$D_1/D_1$" insert --$D_1/\overline{D_1}$--.

Column 4, line 11, after "and" delete "$D_1$" insert --$\overline{D_1}$--.

Column 4, line 15, delete "$D_1$" insert --$\overline{D_1}$--.

Column 4, line 24, after "and" delete "$D_1$ to $D_n$" insert --$\overline{D_1}$ to $\overline{D_n}$--.

Column 6, line 12, delete "$D_1/D_1$ to $D_n/D_n$" insert --$D_1/\overline{D_1}$ to $D_n/\overline{D_n}$--.

Column 6, lines 15 & 16, delete "$D_1/D_1$ to $D_n/D_n$" insert --$D_1/\overline{D_1}$ to $D_n/\overline{D_n}$--.

Column 6, line 20, delete "$D_1/D_1$ to $D_n/D_n$" insert --$D_1/\overline{D_1}$ to $D_n/\overline{D_n}$--.

Column 6, line 37, delete "$D_1/D_1$ to $D_n/D_n$" insert --$D_1/\overline{D_1}$ to $D_n/\overline{D_n}$--.

Column 6, lines 49 & 50 delete "$D_1/D_1$ through $D_n/D_n$" insert --$D_1/\overline{D_1}$ through $D_n/\overline{D_n}$--.

Column 6, line 55, delete "$D_1$" insert --$\overline{D_1}$--.

Column 7, line 6, delete "$D_1/D_1$ to $D_n/D_n$" insert --$D_1/\overline{D_1}$ to $D_n/\overline{D_n}$--.

UNITED STATES PATENT AND TRADEMARK OFFICE
CERTIFICATE OF CORRECTION

PATENT NO. : 5,371,708
DATED : December 6, 1994
INVENTOR(S) : Kobayashi

It is certified that error appears in the above-indentified patent and that said Letters Patent is hereby corrected as shown below:

Column 7, line 11, delete "$D_1$" insert --$\overline{D_1}$--.

Column 8, line 5, delete "$D_1/D_1$" insert --$D_1/\overline{D_1}$.

Column 8, line 14, after "and" delete "$D_1$ to $D_n$" insert --$\overline{D_1}$ to $\overline{D_n}$.

Column 8, line 18, after "and" delete "$D_1$", insert --$\overline{D_1}$--.

Column 8, line 23, delete "$D_1, D_1$" insert --$D_1, \overline{D_1}$--.

Column 8, line 25, after "and" delete "$D_1$" insert --$\overline{D_1}$--.

UNITED STATES PATENT AND TRADEMARK OFFICE
CERTIFICATE OF CORRECTION

PATENT NO. : 5,371,708
DATED : December 6, 1994
INVENTOR(S) : Kobayashi

It is certified that error appears in the above-indentified patent and that said Letters Patent is hereby corrected as shown below:

Column 8, line 29, after "and" delete "$D_1$" insert --$\overline{D_1}$--.

Column 8, line 53, after "and" delete "$D_1$ to $D_n$" insert --$\overline{D_1}$ to $\overline{D_n}$--.

Column 8, line 57, after "and" delete "$D_1$" insert --$\overline{D_1}$--.

Column 8, line 62, after "and" delete "$D_1$" insert --$\overline{D_1}$--.

Column 9, line 7, after "and" delete "$D_1$ to $D_n$-- insert --$\overline{D_1}$ to $\overline{D_n}$--.

Column 9, line 16, after "and" delete "$D_1$ to $D_n$" insert --$\overline{D_1}$ to $\overline{D_n}$--.

Column 9, line 22, delete "$D_1/D_n$ to $D_n/D_n$" insert --$D_1/\overline{D_1}$ to $D_n/\overline{D_n}$--.

Column 9, line 49, delete "$D_1/D_1$ to $D_n/D_n$" insert --$D_1/\overline{D_1}$ to $D_n/\overline{D_n}$--.

Column 9, lines 51 & 52, delete "$D_1/D_1$ to $D_n/D_n$" insert --$D_1/\overline{D_1}$ to $D_n/\overline{D_n}$--.

Column 9, line 52, delete "$R_1$, $R_1$ to $R_n$, $R_n$ insert --$R_1$, $\overline{R_1}$ to $R_n$, $\overline{R_n}$--.

Column 9, line 54, delete "$R_1$, $R_1$ to $R_n$, $R_n$ insert --$R_1$, $\overline{R_1}$ to $R_n$, $\overline{R_n}$--.

Column 10, line 53, delete "$D_1/D_1$" insert --$D_1/\overline{D_1}$--.

UNITED STATES PATENT AND TRADEMARK OFFICE
CERTIFICATE OF CORRECTION

PATENT NO. : 5,371,708
DATED : December 6, 1994
INVENTOR(S) : Kobayashi

It is certified that error appears in the above-indentified patent and that said Letters Patent is hereby corrected as shown below:

Column 10, line 61, after "and" delete "$D_1$ to Dn" insert --$\overline{D_1}$ to $\overline{D_n}$--.

Column 10, line 64, after "and" delete "$D_1$" insert --$\overline{D_1}$--.

Column 11, line 8, delete "$D_1/D_1$" insert --$D_1/\overline{D_1}$--.

Column 11, line 10, after "and" delete "$D_1$" insert --$\overline{D_1}$--.

Column 11, line 14, after "and" delete "$D_1$" insert --$\overline{D_1}$--.

Column 11, line 42, after "and" delete "$D_1$ to $D_n$" insert --$\overline{D_1}$ to $\overline{D_n}$--.

Column 11, line 45, after "and" delete "D1" insert --$\overline{1}$--.
Column 11, line 51, after "and" delete "$D_1$" insert --$\overline{1}$--.

Column 11, line 68, delete "$D_1$ to $D_n$" insert --$\overline{D_1}$ to $\overline{D_n}$--.

Column 12, lines 8 and 9, after "and" delete "$D_1$ to $D_n$" insert --$\overline{D_1}$ to $\overline{D_n}$--.

Column 12, line 11, after "and" delete "$D_1$" insert --$\overline{D_1}$--.

Column 12, line 17, after "and" delete "$D_1$" insert --$\overline{D_1}$--.

Column 12, line 21, delete the 2nd occurrence of "$D_1$ to $D_n$" insert --$\overline{D_1}$ to $\overline{D_n}$--.

Column 12, line 22, delete the 2nd occurrence of "$R_1$ to $R_n$" insert --$\overline{R_1}$ to $\overline{R_n}$--.

UNITED STATES PATENT AND TRADEMARK OFFICE
CERTIFICATE OF CORRECTION

PATENT NO. : 5,371,708
DATED : December 6, 1994
INVENTOR(S) : Kobayashi

It is certified that error appears in the above-indentified patent and that said Letters Patent is hereby corrected as shown below:

Column 12, line 33, delete "$R_1$" insert --$\overline{R_1}$--.

Column 12, line 44, after "and" delete "$D_1$ to $D_n$" insert --$\overline{D_1}$ to $\overline{D_n}$--.

Column 12, line 55, delete "$D_1$, $D_1$ to $D_n$, $D_n$", insert --$D_1$, $\overline{D_1}$ to $D_n$, $\overline{D_n}$--.

Column 12, lines 66 & 67 delete "$D_1$, $D_1$ to $D_n$, $D_n$", insert --$D_1$, $\overline{D_1}$ to $D_n$, $\overline{D_n}$--.

Column 13, line 13, after "and" delete "$D_1$ to $D_n$", insert --$\overline{D_1}$ to $\overline{D_n}$--.

Signed and Sealed this

Sixteenth Day of May, 1995

Attest:

BRUCE LEHMAN

*Attesting Officer*  *Commissioner of Patents and Trademarks*